US011171077B2

United States Patent
Ge et al.

(10) Patent No.: US 11,171,077 B2
(45) Date of Patent: Nov. 9, 2021

(54) SEMICONDUCTOR DEVICE WITH LEAD FRAME THAT ACCOMMODATES VARIOUS DIE SIZES

(71) Applicant: NXP USA, INC., Austin, TX (US)

(72) Inventors: You Ge, Tianjin (CN); Meng Kong Lye, Shah Alam (MY); Zhijie Wang, Tianjin (CN)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 16/907,868

(22) Filed: Jun. 22, 2020

(65) Prior Publication Data

US 2021/0013137 A1    Jan. 14, 2021

(30) Foreign Application Priority Data

Jul. 10, 2019  (CN) .......................... 201910619333.5

(51) Int. Cl.
*H01L 23/495*  (2006.01)
*H01L 23/367*  (2006.01)
*H01L 23/31*   (2006.01)
*H01L 23/433*  (2006.01)

(52) U.S. Cl.
CPC .... *H01L 23/49568* (2013.01); *H01L 23/3114* (2013.01); *H01L 23/3672* (2013.01); *H01L 23/4334* (2013.01); *H01L 23/4951* (2013.01); *H01L 23/49541* (2013.01); *H01L 2224/49171* (2013.01)

(58) Field of Classification Search
None
See application file for complete search history.

(56) References Cited

U.S. PATENT DOCUMENTS

| | | | | | |
|---|---|---|---|---|---|
| 5,065,281 | A | * | 11/1991 | Hernandez | H01L 23/4334 361/709 |
| 5,177,669 | A | * | 1/1993 | Juskey | H01L 23/49861 257/675 |
| 5,227,662 | A | * | 7/1993 | Ohno | H01L 23/49527 257/666 |
| 5,334,872 | A | * | 8/1994 | Ueda | H01L 21/565 257/666 |
| 5,345,106 | A | * | 9/1994 | Doering | H01L 21/4875 257/666 |
| 5,367,196 | A | * | 11/1994 | Mahulikar | H01L 23/315 257/787 |
| 5,379,187 | A | * | 1/1995 | Lee | B29C 45/34 174/529 |
| 5,381,042 | A | * | 1/1995 | Lerner | H01L 21/565 257/712 |

(Continued)

*Primary Examiner* — Andres Munoz

(57) ABSTRACT

A semiconductor device is assembled using a lead frame having leads that surround a central opening. The leads have proximal ends near to the central opening and distal ends spaced from the central opening. A heat sink is attached to a bottom surface of the leads and a semiconductor die is attached to a top surface of the leads, where the die is supported on the proximal ends of the leads and spans the central opening. Bond wires electrically connect electrodes on an active surface of the die and the leads. An encapsulant covers the bond wires and at least the top surface of the leads and the die. The distal ends of the leads are exposed to allow external electrical communication with the die.

14 Claims, 7 Drawing Sheets

(56) References Cited

U.S. PATENT DOCUMENTS

| | | | | |
|---|---|---|---|---|
| 5,387,554 A | * | 2/1995 | Liang | H01L 23/4334 29/827 |
| 5,583,371 A | * | 12/1996 | Hori | H01L 23/4334 257/675 |
| 5,594,282 A | * | 1/1997 | Otsuki | H01L 23/3135 257/796 |
| 5,596,231 A | * | 1/1997 | Combs | H01L 23/4334 257/712 |
| 5,598,034 A | * | 1/1997 | Wakefield | H01L 23/315 257/706 |
| 5,650,663 A | * | 7/1997 | Parthasarathi | H01L 23/3736 257/706 |
| 5,650,915 A | * | 7/1997 | Alfaro | H01L 21/50 257/710 |
| 5,691,567 A | | 11/1997 | Lo et al. | |
| 5,798,570 A | * | 8/1998 | Watanabe | H01L 21/565 257/796 |
| 5,822,848 A | | 10/1998 | Chiang | |
| 5,834,831 A | * | 11/1998 | Kubota | H01L 23/49548 257/674 |
| 5,854,511 A | * | 12/1998 | Shin | H01L 23/4334 257/713 |
| 5,859,471 A | * | 1/1999 | Kuraishi | H01L 23/49572 257/666 |
| 5,892,278 A | * | 4/1999 | Horita | H01L 23/4334 257/706 |
| 5,903,052 A | * | 5/1999 | Chen | H01L 23/24 257/706 |
| 5,929,513 A | * | 7/1999 | Asano | H01L 23/49548 257/675 |
| 5,929,514 A | | 7/1999 | Yalamanchili | |
| 6,064,115 A | * | 5/2000 | Moscicki | H01L 23/4334 257/675 |
| 6,072,228 A | | 6/2000 | Hinkle et al. | |
| 6,075,282 A | * | 6/2000 | Champagne | H01L 23/4334 257/666 |
| 6,159,764 A | * | 12/2000 | Kinsman | H01L 23/4334 257/E23.092 |
| 6,166,446 A | * | 12/2000 | Masaki | H01L 23/4334 257/796 |
| 6,184,575 B1 | * | 2/2001 | Chillara | H01L 23/3121 257/692 |
| 6,246,111 B1 | * | 6/2001 | Huang | H01L 21/565 257/666 |
| 6,249,433 B1 | * | 6/2001 | Huang | H01L 23/4334 165/185 |
| 6,255,742 B1 | * | 7/2001 | Inaba | H01L 23/4334 257/796 |
| 6,271,581 B2 | | 8/2001 | Huang et al. | |
| 6,713,864 B1 | * | 3/2004 | Huang | H01L 23/4334 257/692 |
| 6,841,857 B2 | * | 1/2005 | Beer | H01L 23/4334 257/666 |
| 7,038,311 B2 | * | 5/2006 | Woodall | H01L 23/3677 257/706 |
| 7,125,749 B2 | * | 10/2006 | Kinsman | H01L 23/4334 438/122 |
| 7,410,830 B1 | * | 8/2008 | Fan | H01L 23/3107 257/675 |
| 7,928,544 B2 | * | 4/2011 | Feng | H01L 24/49 257/675 |
| 8,624,388 B2 | * | 1/2014 | Sun | H01L 23/36 257/712 |
| 2003/0146511 A1 | * | 8/2003 | Zhao | H01L 23/49816 257/739 |
| 2006/0097371 A1 | * | 5/2006 | Kawasaki | H01L 24/32 257/678 |
| 2007/0215996 A1 | * | 9/2007 | Otremba | H01L 23/4334 257/678 |
| 2009/0309213 A1 | * | 12/2009 | Takahashi | H01L 24/83 257/707 |
| 2010/0255640 A1 | | 10/2010 | Yu et al. | |
| 2013/0320390 A1 | * | 12/2013 | Palaniswamy | H01L 23/49872 257/99 |
| 2020/0312735 A1 | * | 10/2020 | Coffy | H01L 23/3736 |

\* cited by examiner

SEMICONDUCTOR DEVICE WITH LEAD FRAME THAT ACCOMMODATES VARIOUS DIE SIZES

CROSS-REFERENCE TO RELATED APPLICATIONS

This application claims the priority under 35 U.S.C. § 119 of China application no. 201910619333.5, filed on 10 Jul. 2019, the contents of which are incorporated by reference herein.

BACKGROUND

The present invention relates to integrated circuit (IC) packaging, and more particularly to a lead frame for an integrated circuit device that can accommodate various size dies.

There is a continual demand to decrease the cost of assembling semiconductor devices, yet at the same time, accommodate larger dies, allow for more I/Os, and meet all electrical requirements. Accordingly, it would be advantageous to have a low cost package design that has good electrical and mechanical characteristics.

BRIEF DESCRIPTION OF THE DRAWINGS

Aspects, features, and advantages of the invention will become fully apparent from the following detailed description, the appended claims, and the accompanying drawings in which like reference numerals identify similar or identical elements. Certain elements shown in the drawing may exaggerated, and thus not drawn to scale, in order to more clearly present the invention

DETAILED DESCRIPTION

Figure 1A:
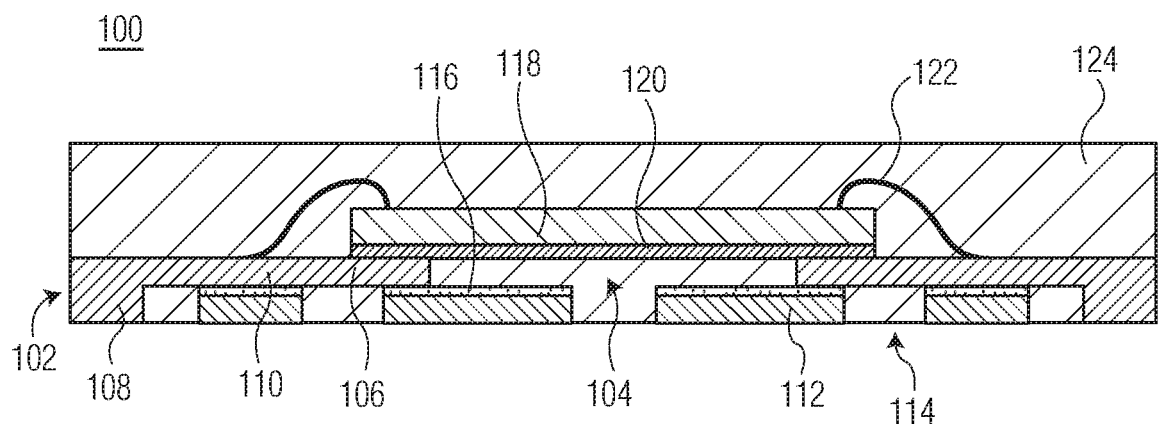
FIG. 1A is an enlarged cross-sectional side view of a semiconductor device in accordance with an embodiment of the present invention.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, the present invention provides a semiconductor device, including a lead frame having a plurality of leads that surround a central die receiving area, wherein the leads have proximal ends near to the die receiving area and distal ends spaced from the die receiving area. A heat sink is attached to a bottom surface of the plurality of leads and a semiconductor die is attached to a top surface of the plurality of leads. The die is supported on the proximal ends of the leads and covers the die receiving area. Bond wires electrically connect electrodes on an active surface of the die and the plurality of leads. An encapsulant covers the electrical connections and at least the top surface of the leads and the die. The distal ends of the leads are exposed to allow external electrical communication with the die, and the bottom surface of the heat sink is exposed to provide good thermal performance.

In another embodiment, the present invention provides a method of assembling a semiconductor device, including the steps of providing a lead frame having a plurality of leads that surround a central die receiving area, wherein the leads have proximal ends near to the die receiving area and distal ends spaced from the die receiving area, attaching a heat sink to a bottom surface of the plurality of leads and then turning over the lead frame and heat sink assembly and attaching a semiconductor die to a top surface of the plurality of leads, where the die is supported on the proximal ends of the leads and covers the die receiving area. The method further includes electrically connecting electrodes on an active surface of the die and the plurality of leads, and covering the electrical connections and at least the top surface of the leads and the die, wherein the distal ends of the leads are exposed to allow external electrical communication with the die.

Figure 1B:
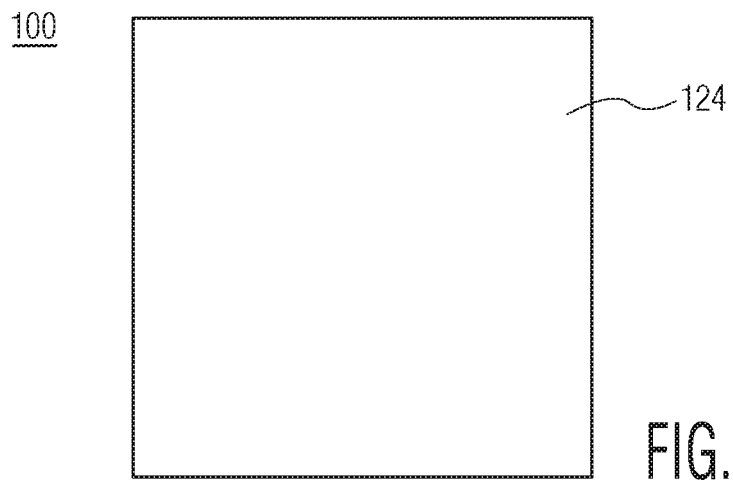
FIGS. 1B and 1C are respective top and bottom plan views of the semiconductor device of FIG. 1A.
Figure 1C:
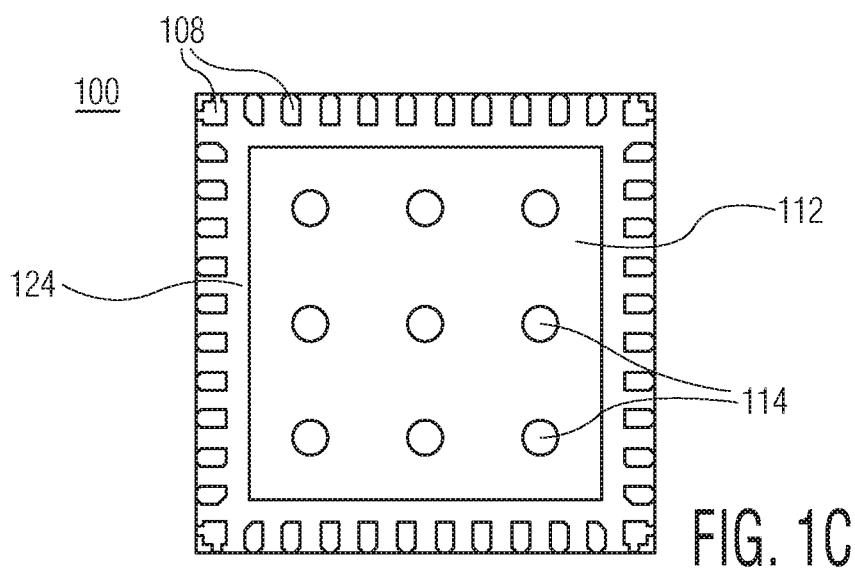

Referring now to FIGS. 1A, 1B and 1C, a cross-sectional side view and top and bottom views of a semiconductor device 100 in accordance with an embodiment of the present invention is shown.

The semiconductor device 100 includes a lead frame comprising a plurality of leads 102 that surround a central opening 104. The leads 102 have proximal ends 106 near to the central opening 104 and distal ends 108 spaced from the central opening 104. Although not apparent in FIG. 1A, the central opening 104 is generally circular (see FIGS. 3A and 3B). The lead frame preferably is formed from a sheet of copper and may be partially or fully coated with one or metals or metal alloys that prevent corrosion or enhance adhesion. In the presently preferred embodiment, the bottom side of the leads 102 is half etched. That is, proximal ends 106 and a central area 110 of the leads are etched to accommodate a heat sink 112, as described below.

The heat sink 112 is sized to fit within the etched portion of the leads 102 such that a top surface of the heat sink 112 is attached to the bottom surface of the plurality of leads 102 and preferably the opposing bottom surface of the heat sink 112 is flush or even with a bottom surface of the distal ends 108 of the leads 102. The heat sink 112 also may be formed of copper and, as shown in FIG. 1C, preferably has a plurality of holes or perforations 114. The perforations 114 help to prevent voids during molding and also help to secure the mold compound to the other components (i.e., mold lock). FIG. 1C shows a 3×3 array of the perforations 114. However, there may be more or fewer perforations and they need not form an array or an array having equal numbers of rows and columns. In the preferred embodiment, the heat sink 112 is attached to the bottom surface of the leads 102 within the half-etched area with an adhesive tape or die attach film 116. Using a tape or film prevents the heat sink 112 from directly contacting the leads 102, which would cause a short circuit. However, in some circumstances, it may be desirable to connect ground leads to the heat sink, in which case slits or holes could be made in the tape to allow for such contact.

A semiconductor die 118 is attached to a top surface of the plurality of leads 102. The die 118 is supported on the proximal ends 106 of the leads 102 and spans the central opening 104. The die 118 may comprise any type of integrated circuit comprising digital and/or analog circuits, and may be a custom or standard design. That is, the invention is not limited by the type of integrated circuit die. The die 118 preferably is attached to the top surface of the leads 102 with a die attach film (DAF) 120. The DAF 120 may cover the entire bottom surface of the die 118 or as shown in FIG. 1A, cover only those portions of the bottom surface of the die that contact the leads 102.

In the presently preferred embodiment, to keep the cost of the package low, the active surface of the die 118 faces away from the leads 102. The active surface of the die 118 includes a plurality of electrodes (die I/O pads) that are electrically connected to respective ones of the leads 102 with bond wires 122. The bond wires 122 may comprise copper or gold and be attached using commercially available wire bonding equipment. In an alternative embodiment, a flip-chip attachment method may be used in which the active surface of the die faces the leads and the die electrodes directly contact the leads. In such a case, the electrodes are bumped to make electrical contact with the leads.

An encapsulant 124 covers the electrical connections (i.e., the bond wires 122) and at least the top surface of the plurality of leads 102 and the die 118. However, the distal ends 108 of the leads 102 are exposed to allow external electrical communication with the die 118. In the top view shown in FIG. 1B, only the encapsulant 124 is visible, while in the bottom view shown in FIG. 10, in addition to the encapsulant 124, the bottom surface of the distal ends 108 of the leads 102 and the bottom surface of the heat sink 112 are visible. The encapsulant 124 defines a package body, with the distal ends 108 of the leads 102 being exposed on both lateral side surfaces and a bottom surface of the package body.

Figure 2:
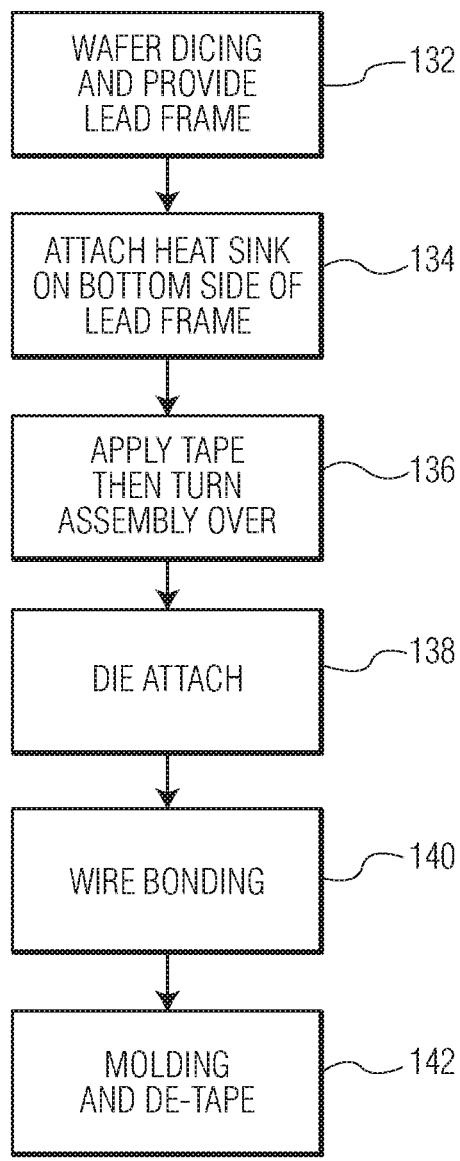
FIG. 2 is a flow chart of a method of assembling a semiconductor device in accordance with an embodiment of the present invention.

FIG. 2 is a flow chart 130 illustrating a method of assembling the semiconductor device 100 of FIGS. 1A, 1B and 1C.

At step 132, a lead frame and a die are provided. The lead frame may be formed by a lead frame manufacturer and shipped to an assembly factory. Similarly, integrated circuit or semiconductor dies may be sourced from companies that that fabricate such dies on wafers. The wafers may be cut or diced to provide individual dies either before being shipped to the assembly factory or the dicing may be performed at the assembly factory.

Figure 3A:
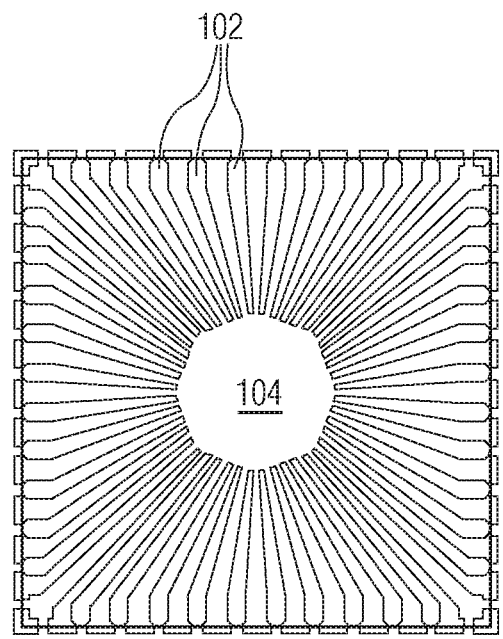
FIGS. 3A and 3B are respective top and bottom plan views of a lead frame used for assembling a semiconductor device in accordance with an embodiment of the present invention.
Figure 3B:
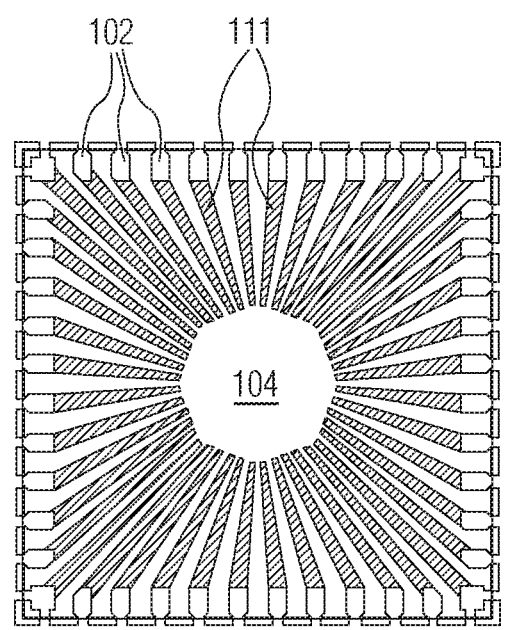

The lead frame provided preferably comprises a plurality of leads 102 that surround a central opening 104, as shown in FIGS. 3A and 3B, which are top and bottom plan views of the lead frame. Although in the presently preferred embodiment, the central opening 104 is generally circular, the central opening may also be rectangular. The reason a circular central opening is preferred is because it allows for a smaller lead pitch so the lead frame can support more leads. The leads 102 have proximal ends 106 adjacent to the central opening 104, distal ends 108 spaced from the central opening 104, and central areas 110 between the proximal and distal ends 106 and 108. As shown in FIG. 3B, a bottom surface of the proximal ends 106 and central areas 110 is etched, providing a half-etched area indicated at 111.

Figure 4A:
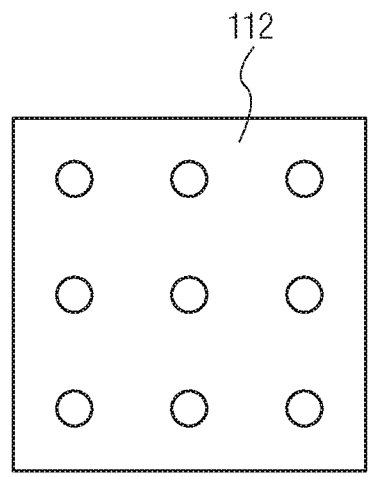
FIG. 4A is a top plan view of a heat sink of the semiconductor device of FIG. 1A.
Figure 4B:
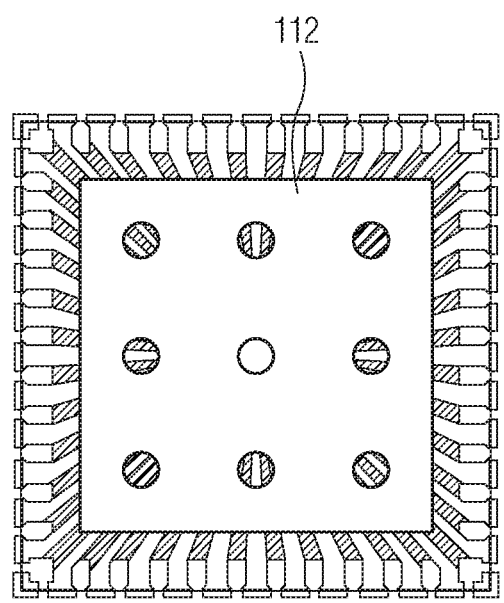
FIG. 4B is a top plan view showing the heat sink of FIG. 4A attached to a bottom side of the lead frame of FIGS. 3A and 3B.

At step 134 (FIG. 2), the heat sink 112 shown in FIGS. 4A and 4B is attached to a bottom surface of the leads 102. Preferably, the heat sink has a thickness that is equal to the amount of the lead that is etched away so that when the heat sink 112 is attached to the bottom surface of the leads 102, the heat sink 112 is seated within the half-etched area 111. The heat sink preferably is attached to the leads 102 with a high temperature double-sided adhesive tape 116. Such high temperature double-sided tapes are commercially available from a large variety of vendors and are known by those of skill in the art. In one embodiment, the tape 116 is attached over a sheet of copper and then individual heat sinks and perforations are formed by punching, whereby the perforations then extend through both the heat sink and the tape 116.

Figure 5:
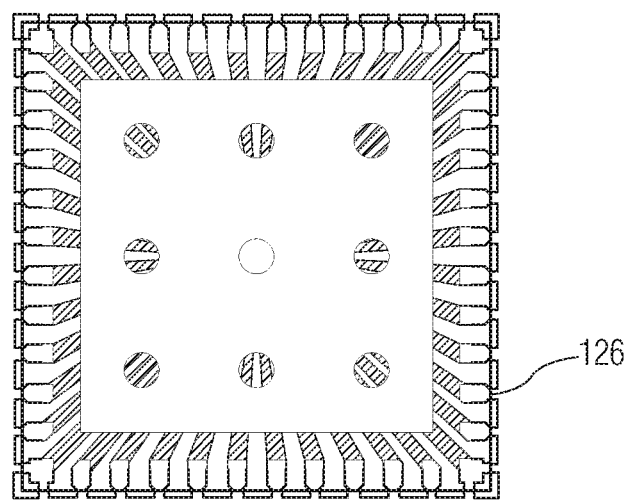
FIG. 5 illustrates a step of applying a piece of tape to the bottom of the lead frame and heat sink assembly of FIG. 4B.

At step 136, a piece of tape 126 is applied over the lead frame and heat sink assembly, as shown in FIG. 5, and then the taped assembly is turned over.

Figure 6A:
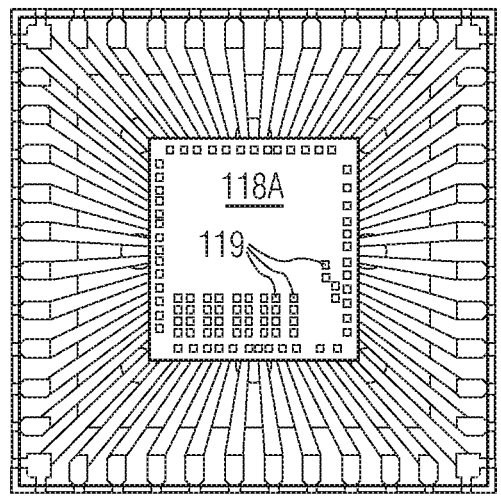
FIG. 6A shows a semiconductor die attached to the leads on a top side of the lead frame and heat sink assembly of FIG. 5 in accordance with one embodiment of the present invention.
Figure 6B:
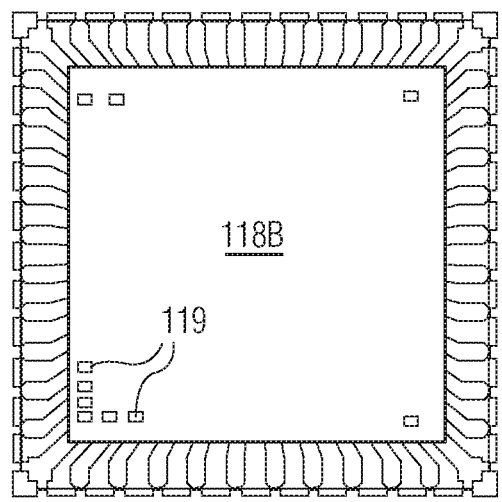
FIG. 6B shows a larger semiconductor die attached to the leads on the top side of the lead frame and heat sink assembly of FIG. 5 in accordance another embodiment of the present invention.

At step 138, the die 118 is attached to the top surface of the leads 102, preferably with a die attach film (DAF), such as AFN301 DAF film available from Furukawa Electric Group of Hiratsuka, Japan. FIG. 6A shows a die 118A attached to the top surface of the leads 102, where die electrodes 119 are visible on the active surface of the die 118A. FIG. 6B shows a larger sized die 118B attached to the top surface of the leads 102. The die 118A is supported by the proximal ends 106 of the leads 102, while the die 116B is supported by the proximal ends 106 and the central area 110 of the leads 102. Thus, as is apparent, the lead frame is able to accommodate various size dies, which facilitates and decreases the cost of assembly.

Figure 7A:
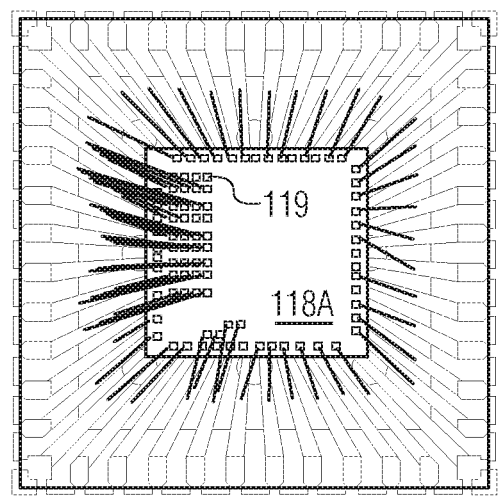
FIGS. 7A and 7B are respective top and side views illustrating a wire bonding step of the method of FIG. 2 performed on the assembly of FIG. 6A.
Figure 7B:
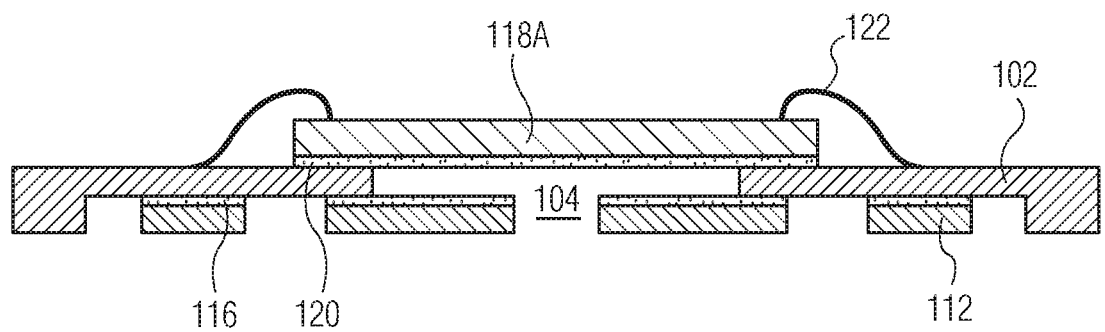

At step 140, the electrodes 119 on the active surface of the die 118A are electrically connected to respective ones of the leads 102 with bond wires 122. The place on the leads 102 where the bond wire 122 is attached depends on the size of the die. For example, for the die 118A shown in FIGS. 6A, 7A and 7B, the bond wires 122 will be attached to the central area 110 of the leads 102, while for the die 118B shown in FIG. 6B, the bond wires 122 will be attached very near to the distal ends 108 of the leads 102.

Figure 7C:
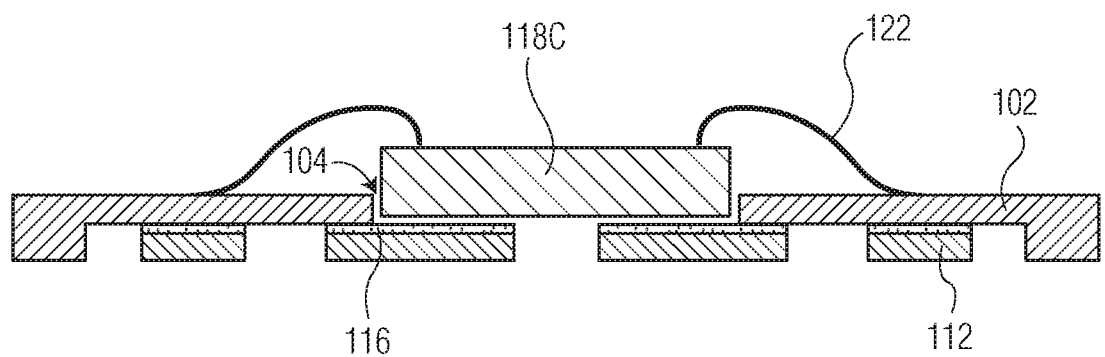
FIG. 7C is a side view illustrating a wire bonding step of the method of FIG. 2 performed on a lead frame and heat sink assembly having a small die attached to a bottom surface of the heat sink in accordance with an embodiment of the present invention.

FIG. 7C shows an embodiment of the semiconductor device having an even smaller die 118C. In this embodiment, the die 118C is small enough to be received within the central opening 104 and is supported by a bottom surface of the heat sink 112.

At step 142, a molding operation is performed to encapsulate the die 118, bond wires 122 and portions of the leads 102 with the mold compound 124, but leave the distal ends 108 of the leads exposed to allow external electrical communication with the die 118. The encapsulant 124 defines a package body and the distal ends 108 of the leads 102 are exposed on both lateral side surfaces and a bottom surface of the package body, thus forming a QFN (Quad Flat No-leads) type package. The tape 126 applied to the bottom surface of the assembly (FIG. 5) also is removed to provide the finished, packaged device 100.

It now should be apparent that the present invention comprises a semiconductor device having a lead frame with a plurality of leads that surround a central opening. A heat sink is attached to a bottom side of the leads and a die is attached to a top side of the leads. Preferably, the bottom side of the leads is half-etched so that the heat sink sits flush with the outer or distal ends of the leads. Various size dies may be attached to the top surface of the leads, and in one embodiment, a small die is disposed within the central opening and is supported by the heat sink. The die is connected to the leads with bond wires and the assembly is encapsulated with an epoxy, thereby forming a QFN type package.

The semiconductor device has the advantages of allowing various size dies, an increased lead count since there are no corner tie bars, good electrical performance, i.e., good on-resistance (RDSon) because long bond wires are not necessary to connect the die electrodes to the leads, and good thermal performance because heat may dissipate through the leads and the heat sink.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

What is claimed is:

1. A semiconductor device, comprising:
a lead frame having a plurality of leads that surround a central opening, wherein the plurality of leads have proximal ends near to the central opening and distal ends spaced from the central opening;
a heat sink attached to a bottom surface of the plurality of leads;
a semiconductor die attached to a top surface of the plurality of leads, wherein the semiconductor die is supported on the proximal ends of the plurality of leads and spans the central opening;
electrical connections between electrodes on an active surface of the semiconductor die and the plurality of leads; and
an encapsulant that covers the electrical connections and at least the top surface of the plurality of leads and the semiconductor die, wherein the distal ends of the plurality of leads are exposed to allow external electrical communication with the semiconductor die;
wherein the semiconductor die is sized to cover the proximal ends of the plurality of leads and a central area of the plurality of leads, and the semiconductor die electrodes are electrically connected to areas of the plurality of leads near to the distal ends of the plurality of leads with bond wires.

2. The semiconductor device of claim 1, wherein:
a top surface of the heat sink is attached to the bottom surface of the plurality of leads and an opposing bottom surface of the heat sink is exposed; and
the bottom surfaces of the plurality of leads at the proximal ends and a central area are etched and the heat sink is disposed within an etched area such that an exposed surface of the heat sink is flush with a bottom surface of the distal ends of the plurality of leads.

3. The semiconductor device of claim 2, wherein the heat sink is perforated.

4. The semiconductor device of claim 1, wherein the electrical connections comprise bond wires that extend from respective ones of the semiconductor die electrodes to respective ones of the plurality of leads.

5. The semiconductor device of claim 1, wherein the central opening is generally circular.

6. The semiconductor device of claim 1, wherein the encapsulant defines a package body and the distal ends of the plurality of leads are exposed on both lateral side surfaces and a bottom surface of the package body.

7. The semiconductor device of claim 1, wherein:
a top surface of the heat sink is attached to the bottom surface of the plurality of leads and an opposing bottom surface of the heat sink is exposed;
the bottom surfaces of the plurality of leads at the proximal ends and a central area are etched such that an exposed surface of the heat sink is flush with a bottom surface of the distal ends of the plurality of leads;
the heat sink is perforated;
the heat sink is attached to the bottom surface of the plurality of leads with an adhesive tape that prevents the heat sink from short circuiting the plurality of leads;
the semiconductor die is attached to the top surface of the plurality of leads with an adhesive tape that prevents the semiconductor die from shorting circuiting the plurality of leads;
the electrical connections comprise bond wires that extend from respective ones of the semiconductor die electrodes to respective ones of the plurality of leads; and.

8. The semiconductor device of claim 1, wherein the heat sink is perforated.

9. A semiconductor device, comprising:
a lead frame having a plurality of leads that surround a central opening, wherein the plurality of leads have proximal ends near to the central opening and distal ends spaced from the central opening;
a heat sink attached to a bottom surface of the plurality of leads;
a semiconductor die attached to a top surface of the plurality of leads, wherein the semiconductor die is supported on the proximal ends of the plurality of leads and spans the central opening;

electrical connections between electrodes on an active surface of the semiconductor die and the plurality of leads; and an encapsulant that covers the electrical connections and at least the top surface of the plurality of leads and the semiconductor die, wherein the distal ends of the plurality of leads are exposed to allow external electrical communication with the semiconductor die;

the heat sink is attached to the bottom surface of the plurality of leads with a first adhesive tape that prevents the heat sink from short circuiting the plurality of leads; and the semiconductor die is attached to the top surface of the plurality of leads with a second adhesive tape that prevents the semiconductor die from shorting circuiting the plurality of leads.

10. The semiconductor device of claim 9, wherein the semiconductor die is sized to cover the proximal ends of the plurality of leads and a central area of the plurality of leads, and the semiconductor die electrodes are electrically connected to areas of the plurality of leads near to the distal ends of the plurality of leads with bond wires.

11. The semiconductor device of claim 9, wherein:

a top surface of the heat sink is attached to the bottom surface of the plurality of leads and an opposing bottom surface of the heat sink is exposed; and the bottom surfaces of the plurality of leads at the proximal ends and a central area are etched and the heat sink is disposed within an etched area such that an exposed surface of the heat sink is flush with a bottom surface of the distal ends of the plurality of leads.

12. The semiconductor device of claim 9, wherein the heat sink is perforated.

13. The semiconductor device of claim 9, wherein the central opening is generally circular.

14. The semiconductor device of claim 9, wherein the encapsulant defines a package body and the distal ends of the plurality of leads are exposed on both lateral side surfaces and a bottom surface of the package body.

* * * * *